United States Patent [19]
Thompson et al.

[11] Patent Number: 5,438,162
[45] Date of Patent: Aug. 1, 1995

[54] METHOD AND APPARATUS FOR ISOLATING ELECTRONIC BOARDS FROM SHOCK AND THERMAL ENVIRONMENTS

[75] Inventors: Craig Thompson, Redmond; Lawrence L. Eakin, Bothell, both of Wash.

[73] Assignee: AlliedSignal Inc., Morris Township, N.J.

[21] Appl. No.: 115,862

[22] Filed: Sep. 2, 1993

Related U.S. Application Data

[62] Division of Ser. No. 943,047, Sep. 10, 1992, Pat. No. 5,285,559.

[51] Int. Cl.⁶ ............................................. H01L 23/28
[52] U.S. Cl. ................... 174/52.2; 206/52.1; 220/453
[58] Field of Search ............... 174/52.1, 52.2, 52.4; 206/521, 521.15, 521.2, 523, 305, 328, 334, 811; 220/415, 453, 468, 452, 429, 469; 455/96, 98; 29/841, 832

[56] References Cited

U.S. PATENT DOCUMENTS 5,123,538  6/1992  Groenewegen ............... 206/521
5,296,417  3/1994  Claar et al. .................... 501/87

*Primary Examiner*—Leo P. Picard
*Assistant Examiner*—Christopher Horgan
*Attorney, Agent, or Firm*—Howard G. Massung

[57] ABSTRACT

An apparatus for isolating electronic devices from mechanical shock and thermal environments utilizes a metal outer protective shell surrounding the electronic device to be protected. Interposed between the protective shell and the electronic device are a thermal insulating layer, a layer of phase change material and a layer of mechanical shock absorbent material.

8 Claims, 1 Drawing Sheet

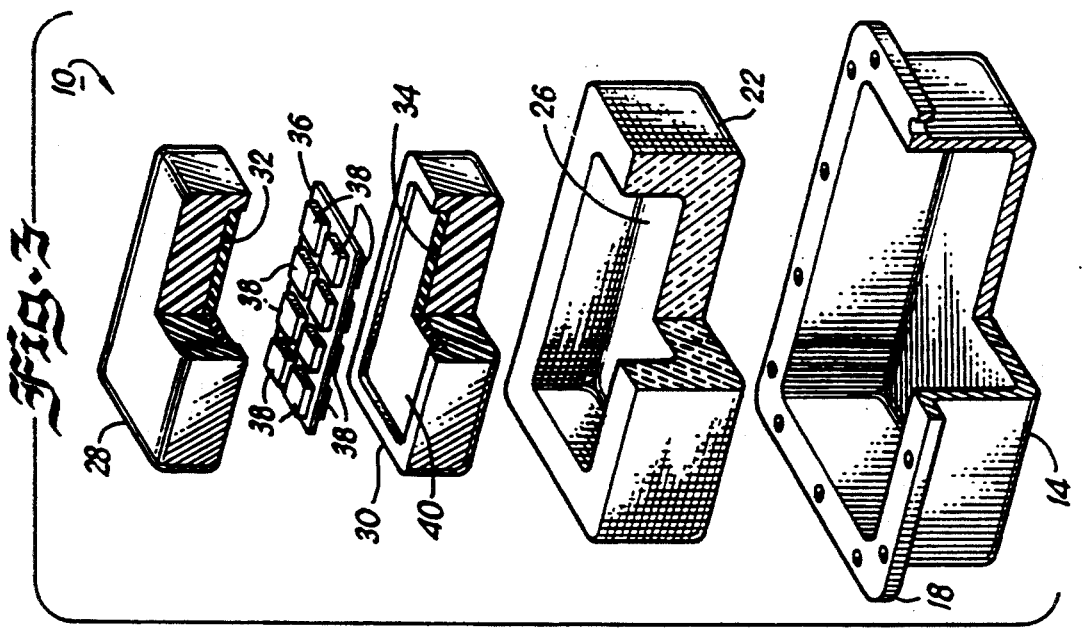
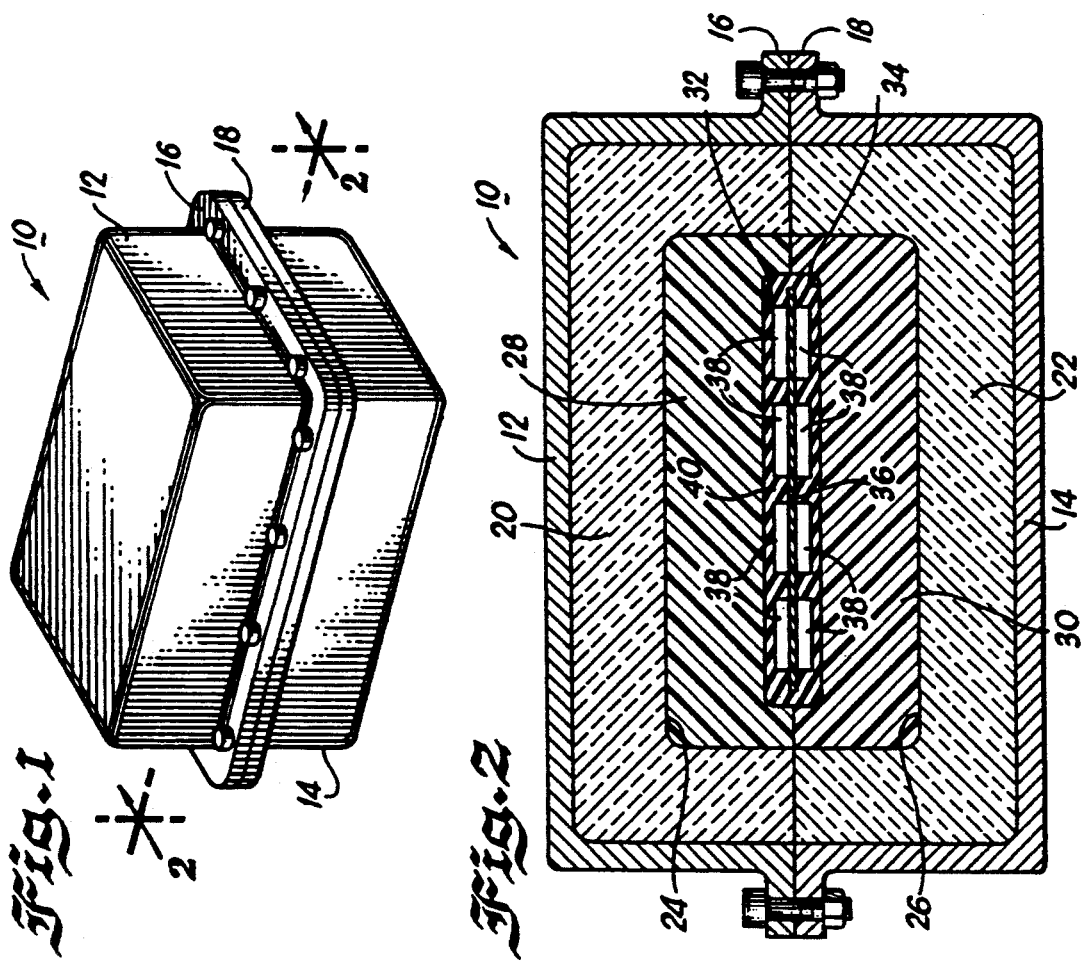

METHOD AND APPARATUS FOR ISOLATING ELECTRONIC BOARDS FROM SHOCK AND THERMAL ENVIRONMENTS

This is a division of application Ser. No. 07/943,047, filed Sep. 10, 1992, now U.S. Pat. No. 5,285,550.

BACKGROUND OF THE INVENTION

1. Field of the Invention

The present invention relates to crash survivable protective enclosures for flight recorders used in aircraft and other vehicles operating over land and water. More particularly, the invention is directed toward a crash survivable enclosure which is capable of withstanding high impact, shock and mechanical penetration forces that commonly occur in a crash and the high temperatures, flames and heat that often develop after a crash. In addition, the enclosure is specially designed for resisting damage to solid state memory devices contained therein, even if the enclosure is subjected to immersion in fresh water or salt water for a prolonged period.

2. Description of the Prior Art

Solid state memory devices have been used in flight recorders for recording essential flight data or information useful in determining causes of crashes or other mishaps in aircraft and other vehicles. When a crash occurs, it is essential that the recorded information on board survive the crash and subsequent events including heat, cold, flame and fire that may afterwards ensue. In addition, should the crash or impact occur over the ocean or another body of water, it is essential that the crash survivable portion of the flight data recorder remain intact for a prolonged period of time, even though the enclosure is submerged to a substantial depth in sea water or fresh water until the recorder is eventually located and retrieved for examination of the data contained in the solid state memory devices thereof.

U.S. Pat. No. 4,694,119 discloses a solid state memory contained in a small crash protective container. The device is encapsulated in a heat sink formed of a synthetic amide wax designed to change phase at a temperature below the maximum acceptable temperature of the memory device to thereby protect the solid state memory or other solid state devices from damage due to heat and fire.

U.S. Pat. No. 4,944,401 also discloses a solid state memory device carried in a crash survivable protective enclosure and encapsulated in a synthetic wax having a relatively high heat of fusion so as to provide a heat sink for the protection of the solid state memory device contained in the protective enclosure.

U.S. Pat. No. 5,123,538 discloses a similar devices having an inner enclosure that acts as a sacrificial anode to protect an electronic device from salt water. A plastic or rubber conformal coating surrounds the device contained in the inner enclosure.

SUMMARY

While the systems disclosed in the abovementioned patents provided good penetration protection and thermal protection, they could use improvement in certain areas. For example, because the encapsulating synthetic wax is relatively hard, it provides little mechanical shock isolation to the device being protected. Also, because the melting point of the encapsulating wax is near or sometimes above the maximum temperature that can be tolerated by the device, the encapsulation process is critical and costly and subjects the device being encapsulated to thermal stress. In addition, the encapsulating wax adheres to the device being encapsulated and is very difficult to remove when access to the protected device is necessary, for example, for the purpose of data retrieval or repair. In the case of a repair, the device must be re-encapsulated, thus submitting the protected device to another thermal cycle that may potentially damage the device.

Thus, it is an object of the present invention to provide a protective enclosure for an electronic device that overcomes many of the disadvantages of the prior art protective enclosures.

It is another object of the present invention to provide a protective enclosure for an electronic device that has improved mechanical shook protection over the prior art enclosures.

It is yet another object of the present invention to provide a protective enclosure that permits more ready access to the device being protected than do the prior art enclosures.

It is yet another object of the present invention to provide a protective enclosure that does not subject the device being protected to thermal stress during assembly, including initial assembly and reassembly after repair.

It is another object of the present invention to provide a protective enclosure for an electronic device that is more easily assembled and disassembled than the prior art enclosures.

It is another object of the present invention to provide a protective enclosure that can be fabricated at a lower cost than prior art enclosures providing similar performance.

Thus, in accordance with a preferred embodiment of the invention, the synthetic wax is pre-formed in a process not involving the device to be protected. The synthetic wax is pre-formed into two sections with at least one section having an accessible cavity capable of receiving the device to be protected formed therein. The cavity is filled with a rubber-like material that has a fluid state when the cavity is being filled and which cures to a rubber-like solid state. After the cavity has been filled, the device to be protected is immersed in the fluid and the cavity is closed by bringing the two sections of the pre-formed synthetic wax material together. The two sections of the pre-formed wax material are surrounded by a thermal insulating layer which is, in turn, surrounded by a penetration resistant shell, such as a metal shell.

BRIEF DESCRIPTION OF THE DRAWING

These and other objects and advantages of the present invention will become readily apparent upon consideration of the following detailed description and attached drawing wherein:

FIG. 1 is a perspective view of the crash survivable enclosure according to the present invention;

FIG. 2 is a cross-sectional view of the enclosure according to the invention taken along line 2—2 of FIG. 1 showing the device to be protected contained therein; and FIG. 3 is an exploded perspective view, partially in cross section, of the enclosure according to the invention.

DETAILED DESCRIPTION OF THE PREFERRED EMBODIMENT

Referring now to the drawing, with particular attention to FIG. 1, the protective enclosure according to the invention is generally designated by the reference numeral 10. The protective enclosure 10 has an outer penetration resistant shell that is formed in two sections 12 and 14. Preferably, the sections 12 and 14 forming the outer shell are formed from a cast metal such as a titanium alloy or other material that exhibits a relatively high resistance to crushing and penetration. The sections 12 and 14 of the outer shell have flanges 16 and 18 extending therefrom to permit the sections 12 and 14 to be fastened together by screws or other appropriate fasteners.

A pair of shell-like thermal liners 20 and 22 (FIG. 2) are formed within each of the sections 12 and 14 of the outer shell. The thermal liners 20 and 22 provide a first thermal barrier for shielding components that are located in the interior of the protective housing from high temperature and fires that may occur during an aircraft crash. The thermal liners 20 and 22 are substantially rectangular in cross-sectional geometry relative to each of their major axes and form a pair of inwardly extending cavities 24 and 26, respectively. Each section 20 and 22 of the thermal liner is preferably a unitary structure that is formed of a solid material that is a good thermal insulator (i.e., has a low thermal conductivity, K) and has relatively low density. Suitable materials include thermal insulators that are proprietary combinations of fibrous material and very fine particulate matter with MIN-K 2000 and MICROTHERM being the trademarks for two such satisfactory materials that are manufactured by Johns-Mansville Co. of Denver, Colo. and by Micropore Insulation, Ltd. of Upton-Wirral Merseyside, England, respectively. Because it exhibits very low thermal conductivity e.g., K=0.146 at 170° C., K=0.27 at 1100° C., the material marketed under the trademark MICROTHERM is currently the preferred material for the sections 20 and 22 of the thermal liner.

Contained within the cavities 24 and 26 of the thermal insulator sections 20 and 22 is a thermal mass formed in two sections 28 and 30 (FIGS. 2 and 3). The sections 28 and 30 are pre-formed in a separate process so that their outer walls conform to the respective shapes of the cavities 24 and 26. Also pre-formed within the sections of thermal mass 28 and 30 are a pair of respective cavities 32 and 34 that, when aligned, form a chamber for containing the electronic device to be protected. In the embodiment illustrated, the device being protected is a printed circuit board 36 and plurality of memory devices 38 disposed on opposite sides of the board 36; however, various other mechanical shock and thermal sensitive devices could be protected.

The phase transition thermal insulator material currently employed to form the shells 28 and 30 in the practice of the invention are amide-type synthetic organic waxes and a solid solution of pentaerythritol ($C_5H_{12}O_4$). One amide wax that has been successfully employed in an embodiment of the invention is a proprietary formulation of Glyco, Inc. of Greenwich, Conn. (now owned by Lonza, Ins. of Fair Lawn, N.J.), which is marketed under the trademark Acrawax HM 23. Other such waxes are commercially available, including a wax chemically defined as N,N'ethylenebisstearamide (or by the synonym N,N'distearoylethylenediamine) having a chemical configuration of $H_{33}C_{17}COHNC_2H_4NHCOC_{17}H_{35}$, wherein the alkyd radials extend linearly from amide linkages on either side of the molecule. This synthetic wax also is available from Glyco, Inc. of Greenwich, Conn. under the trademark Acrawax C. Both of the two above specifically referenced synthetic waxes currently are utilized in numerous commercial applications that are not related to this invention.

With respect to the present invention, the above-referenced amide wax marketed under the trademark Acrawax HM 23 is advantageous because it exhibits a high flash point (277° C.) and melting point (140° C.) that has been found to suitably protect the solid state memory devices that are utilized in a flight data recorder. Use of N,N'ethylenebisstearamide (flash point 271° C., melting point 120° C.) can be advantageous, wherein a lower melting point is desirable. Further, both of these materials are amenable to conventional manufacturing processes since they are non-toxic and are available in various particulate forms.

Pentaerythritol, which is a poly-alcohol having a tetrahedral structure having a central carbon atom attached to four outer carbon atoms that are located at the vertices of a regular tetrahedron, also can be advantageously employed. This material exhibits a melting point of between 258° C. end 260° C., a solid state transition temperature of 184°-185° C., and a latent heat of transition of approximately 72 calories/gram.

Inside the chamber formed by the cavities 32 and 34 is a rubber-like substance 40 that supports the circuit board 36 and the memory units 38. The rubber-like material 40 also serves to protect the board 36 and memory units 38 from mechanical shock and vibration. A silicon rubber is used as the rubber-like material 40 because it has a similar thermal conductivity to that of the wax-like material forming the shells 28 and 30. The rubber-like material 40 is obtained in a high viscosity fluid form and used to fill the cavities 32 and 34. Once the cavities have been filled by an appropriate amount of fluid rubber-like material, the board 36 and the memory units 38 are immersed in the fluid and the cavity closed by bringing the sections 28 and 30 together. In time, the silicon rubber cures to form a solid rubber-like substance. The resulting rubber-like encapsulant acts as the final thermal barrier and provides protection from mechanical shock and vibration. A room temperature vulcanizing silicone rubber such as a silicone rubber manufactured by the General Electric Company, Silicone Products Division, Waterford, N.Y., under the trade name RTV 88 is particularly suitable for use as the rubber-like material because it has the appropriate physical and mechanical properties.

In addition to isolating the board, the use of the rubber-like encapsulant has producability advantages. Because the wax-like material no longer needs to be applied directly to the electronic board, it can be molded at a much higher temperature in easier methods. Also, in the event of data retrieval after a fire, or repair or rework, the wax-like thermal mass is easily removable. In the event of repair or rework, the wax-like thermal mass is now reusable.

Another advantage is the easy removal of the rubber-like encapsulant from the components. In order to accomplish this goal, a two-part time curing silicone, such as the RTV 88 was selected. This material is a spreadable gel that cures in twenty-four hours, but does not adhere to non-silicone surfaces without use of a primer. Because easy removal of the encapsulant from the electronics is desired, the primer is not used. After cure, the encapsulant peels easily from the electronics allowing easy access for data retrieval, repair or rework.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. Apparatus for isolating an electronic device from mechanical shock and thermal environments, comprising:
   a layer of a rubber-like material surrounding said electronic device;
   a mass of preformed wax-like material having a high heat of fusion for absorbing a substantial quantity of heat before rising above a critical temperature limit in direct contact with and surrounding said rubber-like material;
   a heat insulating layer surrounding said mass of wax-like material; and
   a metal shell surrounding said heat insulating layer.

2. The apparatus of claim 1, wherein:
   said rubber-like material is a fluid that surrounds said electronic device and cures to form a resilient layer of shock resistant material for protecting said electronic device against mechanical shock forces.

3. The apparatus of claim 2, wherein:
   said fluid is a silicone rubber-like material that cures in time to form a layer of rubber-like consistency.

4. The apparatus of claim 3, wherein:
   said silicone rubber-like material has a non-adhesive property after curing so as to be readily peeled away from said electronic device.

5. The apparatus of claim 3, wherein:
   said silicone rubber material is of a type that cures in approximately twenty-four hours after being applied to said electronic device.

6. The apparatus of claim 1, wherein:
   said wax-like material is a pre-formed mass having a cavity formed therein.

7. The apparatus of claim 6, wherein:
   said rubber-like material is contained in said cavity.

8. Apparatus for isolating a heat and mechanical shock sensitive device from heat and mechanical shock, comprising:
   a resilient shock-absorbent structure supporting said device;
   a heat sink formed by a preformed mass of material having high heat of fusion directly contacting and surrounding said device and shock-absorbent structure; and
   a heat insulating and physical penetration resistant shell surrounding said heat sink.

* * * * *